(12) United States Patent
Chiou (10) Patent No.: US 7,371,662 B2
(45) Date of Patent: May 13, 2008

(54) METHOD FOR FORMING A 3D INTERCONNECT AND RESULTING STRUCTURES

(75) Inventor: Wen-Chih Chiou, Miaoli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 71 days.

(21) Appl. No.: 11/385,968

(22) Filed: Mar. 21, 2006

(65) Prior Publication Data

US 2007/0224776 A1 Sep. 27, 2007

(51) Int. Cl.
*H01L 31/00* (2006.01)
(52) U.S. Cl. ............... 438/459; 438/455; 257/E21.088
(58) Field of Classification Search ................ 438/455, 438/459, 107
See application file for complete search history.

(56) References Cited

U.S. PATENT DOCUMENTS

2004/0152282 A1* 8/2004 Tong et al. ................. 435/455

OTHER PUBLICATIONS

Guarini, K. W., et al., "Electrical Integrity of State-of-the-Art 0.13 µm SOI CMOS Devices and Circuits Transferred for Three-Dimensional (3D) Integrated Circuit (IC) Fabrication," IEDM, IEEE, 2002, pp. 943-945.

* cited by examiner

*Primary Examiner*—David A. Zameke
*Assistant Examiner*—Jenny L Wagner
(74) *Attorney, Agent, or Firm*—Slater & Matsil, L.L.P.

(57) ABSTRACT

A method for forming three-dimensional (3D) integrated circuits includes providing a first wafer comprising a silicon layer on a top surface of the first wafer, providing a second wafer comprising a silicon oxide layer on a top surface of the second wafer, bonding the first and the second wafers by placing a top surface of the silicon oxide layer against a top surface of the silicon layer and applying a pressure, and forming vias electrically interconnecting integrated circuits in the first and second wafers. The bonding is preferably preformed using a low pressure. A CMP and a plasma treatment are preferably performed to substantially flatten the surface of the silicon oxide layer before bonding.

17 Claims, 5 Drawing Sheets

METHOD FOR FORMING A 3D INTERCONNECT AND RESULTING STRUCTURES

TECHNICAL FIELD

This invention relates generally to integrated circuits, and more particularly to three-dimensional integrated circuits, and even more particularly to a structure and manufacturing processes for forming three-dimensional integrated circuits.

BACKGROUND

Since the invention of the integrated circuit, the semiconductor industry has experienced a constant rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D integrated circuit formation, there are physical limits to the density that can be achieved in two dimensions. One of these limits is the minimum size needed to make these components. Also, when more devices are put into one chip, more complex designs are required.

An additional limit comes from the significant increase in the number and length of interconnections between devices as the number of devices increases. When the number and length of interconnections increase, both circuit RC delay and power consumption increase.

Three-dimensional (3D) integrated circuits (ICs) are therefore created to resolve the above-discussed limitations. In a typical 3D integrated circuit formation process, two wafers, each including an integrated circuit, are formed. The wafers are then bonded with the devices aligned. Deep vias are then formed to interconnect devices on the first and second substrates.

Much higher device density has been achieved using 3D IC technology, and up to six layers of wafers have been bonded. As a result, the total wire length is significantly reduced. The number of vias is also reduced. Accordingly, 3D technology has the potential of being the mainstream technology of the next generation.

Conventional methods for bonding two wafers include adhesive bonding, direct copper bonding and direct oxide bonding. Adhesive bonding is performed by bonding two wafers with an adhesive. This approach is relatively easy and the cost is low. A main problem of this approach is the low thermal stability and extendibility. When a third wafer is bonded to the two already bonded wafers, the existing adhesive between the first and the second wafers may contract under the thermal conditions, and the potentially uneven contraction generates stresses. Therefore, it is difficult to bond three or more wafers together.

In direct copper bonding, each of the two wafers have copper pads exposed on the surfaces of the wafers, and the two wafers are bonded by applying a high pressure, which is typically about 80 pounds per square inch (psi) to about 100 psi. Under such a high pressure, low-k dielectric materials on the wafers are densified, and the respective k values are increased, undesirably.

In direct oxide bonding, the two wafers have oxide layers on the respective surfaces of the wafers, and are bonded oxide-to-oxide. Vias are then formed through the oxide layers to connect the wafers. Direct oxide bonding typically requires a temperature as high as 900° C., or a temperature of about 400° C. to about 500° C. plus a pressure of about 40 psi to about 50 psi. The high temperature and/or high pressure also cause the k values of the low-k dielectric materials to increase.

The conventional adhesive bonding, direct copper bonding and direct oxide bonding are suitable for forming 3D integrated circuits with relatively high-k dielectric materials, for example, dielectric materials having k values greater than about 3.5. However, these methods either cause an increase in k values of porous low-k materials or have an extendibility problem. As such, the existing technologies are not suitable for 3D integrated circuits with low-k dielectric materials, and thus a novel method is needed.

SUMMARY OF THE INVENTION

In accordance with one aspect of the present invention, a method of forming three-dimensional integrated circuits includes providing a first wafer comprising a silicon layer on a top surface of the first wafer, providing a second wafer comprising a silicon oxide layer on a top surface of the second wafer, bonding the first and the second wafers by placing a top surface of the silicon oxide layer against a top surface of the silicon layer and applying a pressure, and forming vias electrically interconnecting integrated circuits in the first and second wafers. The bonding is preformed using a low pressure.

In accordance with another aspect of the present invention, a method of forming three-dimensional integrated circuits includes providing a first wafer comprising a first interconnect structure over a first substrate, providing a second wafer comprising a second interconnect structure over a second substrate wherein the second substrate comprises silicon. The method further includes forming a silicon oxide layer over the first interconnect structure, attaching a handling wafer over the second interconnect structure, thinning the second substrate, bonding the first and the second wafers by placing a top surface of the silicon oxide layer against an exposed surface of the second substrate and applying a pressure, removing the handling wafer, and forming vias connecting the first interconnect structure and the second interconnect structure. At least one of the first and second interconnect structures includes a low-k dielectric material.

In accordance with yet another aspect of the present invention, a method of forming three-dimensional integrated circuits includes providing a first wafer comprising a first interconnect structure over a first substrate, forming a silicon oxide layer over the first interconnect structure using plasma enhanced chemical vapor deposition, performing a chemical mechanical polish to the silicon oxide layer, performing a plasma treatment to the silicon oxide layer, providing a second wafer comprising a second interconnect structure over a second substrate, attaching a handling wafer over the second interconnect structure, thinning the second substrate, bonding the first and the second wafers by placing a top surface of the silicon oxide layer against a surface of the second substrate and applying a pressure, removing the handling wafer, and forming vias connecting the first interconnect structure and the second interconnect structure. Preferably, the first interconnect structure comprises a first low-k dielectric material. Also preferably, the second substrate is a silicon substrate and the second interconnect structure comprises a second low-k dielectric material.

In accordance with yet another aspect of the present invention, a 3D integrated circuit structure includes a first wafer and a second wafer, each comprising a substrate having devices formed thereon and an interconnect structure over the substrate. The 3D integrated circuit structure further includes a composite layer comprising a silicon layer bonded to the silicon oxide layer, wherein the silicon layer and the silicon oxide layer are bonded by covalent bonds, and wherein the composite layer is between and bonded to the first wafer structure and the second wafer structure. Vias are used to connect the interconnect structures of the first and the second wafer structures. Preferably, at least one of the interconnect structures of the first and second wafers comprises a low-k dielectric material.

In accordance with yet another aspect of the present invention, a 3D integrated circuit structure includes a semiconductor substrate having devices formed thereon, a first interconnect structure over the semiconductor substrate, a silicon oxide layer over the first interconnect structure, a silicon layer on the silicon oxide layer with devices formed thereon, a second interconnect structure over the silicon layer, and vias connecting the first interconnect structure and the second interconnect structure. The silicon layer and the silicon oxide layer are bonded by covalent bonds. Preferably, at least one of the first and the second interconnect structures comprises a low-k dielectric material.

The advantageous features of the present invention include low pressing forces and low temperatures in the bonding process, so that the effects are reduced.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming three-dimensional (3D) integrated circuits having low-k dielectric materials is provided. The intermediate stages of manufacturing a preferred embodiment of the present invention are illustrated. Throughout the various views and illustrative embodiments of the present invention, like reference numbers are used to designate like elements.

Figure 1:
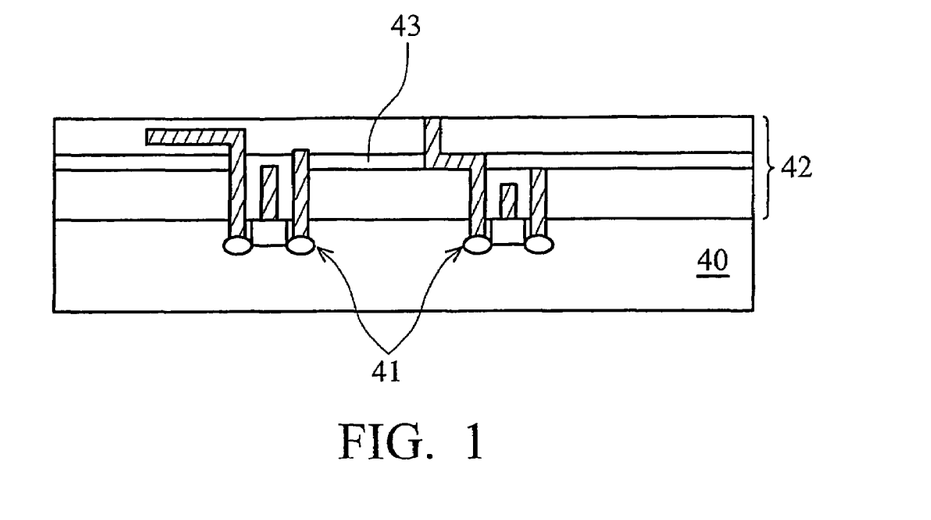
FIGS. 1 through 8 are cross-sectional views of intermediate stages in the manufacture of a preferred embodiment, wherein two wafers are bonded.

In FIG. 1, a first wafer is provided. In the preferred embodiment, the first wafer has a silicon substrate 40, on which devices 41 are formed. As is schematically shown, interconnect structure 42 is formed over the silicon substrate 40. Interconnect structure 42 includes metallization layers and connecting vias, and dielectric layers in which the metallization layers and connecting vias are formed. An exemplary dielectric layer 43 is shown. For simplicity, the dielectric layer 43 is not shown in subsequent drawings. Preferably, no passivation layer is formed on interconnect structure 42. In the preferred embodiment, the dielectric layers comprise low-k dielectric materials with k values of less than about 3.1, and more preferably less than about 2.5. The porosities in the low-k dielectric materials are preferably greater than about 0 percent, and more preferably greater than about 25 percent. Exemplary low-k dielectric materials include carbon-doped silicon oxide, spin-on organic material, porous materials, and the like.

Figure 2:
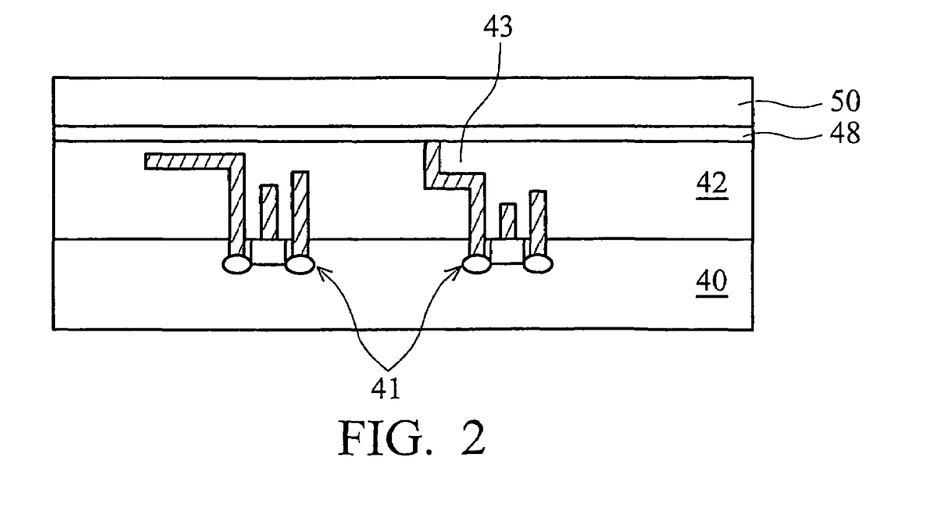

Referring to FIG. 2, after a desired number of metallization layers and corresponding vias are formed, an etch stop layer (ESL) 48 is formed on interconnect structure 42, followed by the formation of a silicon oxide layer 50. The number of metallization layers may range from one to nine or even higher. In the preferred embodiment, the number of metallization layers is between three and five. ESL 48 preferably comprises SiC, although other commonly used ESL materials such as SiOC, SiON, and SiN, can also be used. Alternatively, instead of ESL 48, a metal cap (not shown), preferably comprising cobalt, Co—W, or Co—Si, is formed on the top metallization layer. Since a subsequent etching for via openings will stop on and expose the metal cap, the metal cap acts as an etch stop layer.

The preferred silicon oxide materials in silicon oxide layer 50 include silane oxide and tetra-ethyl-ortho-silicate (TEOS) oxide. A low-thermal-budget method is preferably used for forming the silicon oxide layer 50. In the preferred embodiment, plasma enhanced chemical vapor deposition (PECVD) is used, although other low-thermal-budget methods such as carbon-doped silicon oxide and spin-on oxide can also be used, provided that the temperatures employed by these methods are less than about 400° C., and more preferably less than about 250° C. The thickness of the silicon oxide layer 50 is preferably between about 100 Å and about 5000 Å.

A chemical mechanical polish (CMP) is preferably performed on the surface of silicon oxide layer 50. After CMP, the surface of the silicon oxide layer 50 is preferably substantially flat, and the unevenness of the surface is preferably less than about 10 Å from the lowest point to the highest point.

A plasma treatment is then performed to the surface of the silicon oxide 50. The plasma treatment helps break existing bonds between silicon atoms and other atoms, such as Si—O bonds in Si—O—Si. Dangling bonds, such as Si—O—, are created on the surface of the silicon oxide layer 50. In an exemplary embodiment, the plasma treatment conditions include an ambient pressure of about 1 mtorr to about 10 mtorr, a temperature of about 20° C. to about 400° C., and a duration of about 2 seconds to about 30 seconds. The ambient is preferably filled with gases such as $H_2$, $NH_3$, and/or Ar, and the like. In another exemplary embodiment, the plasma treatment can also include an ambient pressure of about 1 atmosphere, a temperature of about 20° C. to about 200° C., and a duration of about 2 seconds to about 30 seconds. The ambient is preferably filled with gases such as Ar, $H_2$, and the like.

Figure 3A:
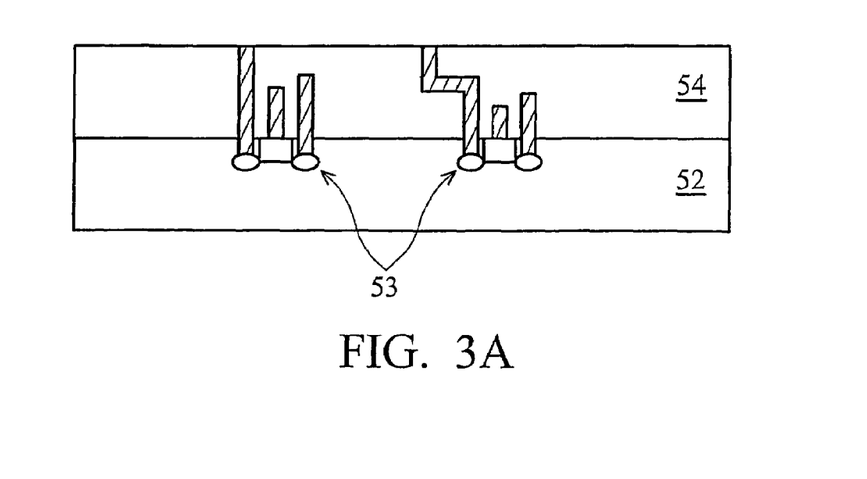

FIG. 3A illustrates a second wafer including a substrate 52, which comprises devices 53 formed thereon. An interconnect structure 54 is then formed over the substrate 52. Similar to the first wafer, the interconnect structure 54 includes metallization layers and connecting vias in the dielectric layers. Preferably, the dielectric layers comprise low-k dielectric materials with k values of less than about 3.1, and more preferably less than about 2.5.

Figure 3B:
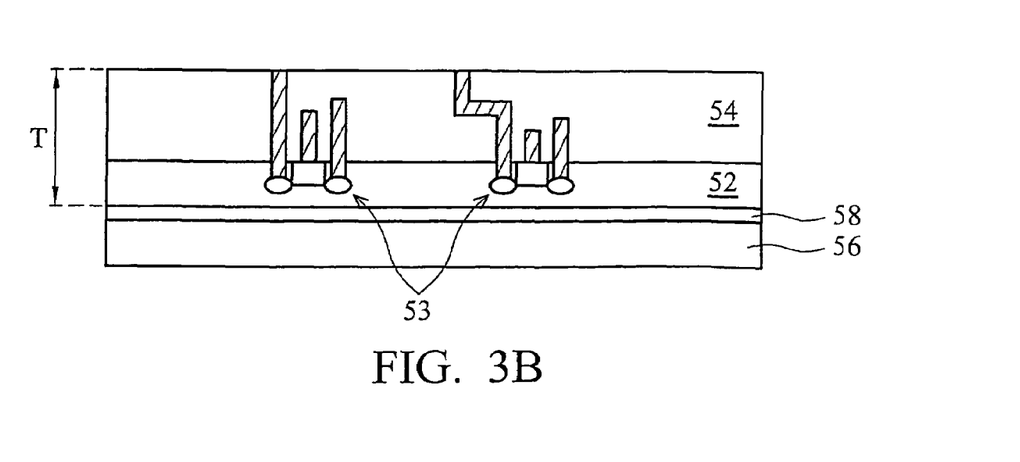

In other embodiments, as shown in FIG. 3B, the substrate in the second wafer has a silicon-on-insulator structure, wherein the silicon substrate 52 is on an insulator 58, which further resides on a semiconductor material 56. Preferably, the total thickness T of substrate 52 and the interconnect structure 54 is between about 10 μm to about 15 μm. Alternatively, the total thickness T of substrate 52 and interconnect structure 54 may be greater than about 15 μm or less than about 10 μm, depending on the total number of wafers to be bonded and the technology used.

Figure 4:
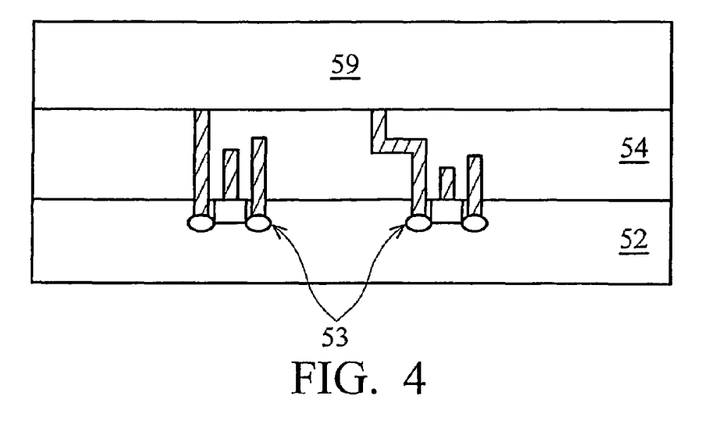

Referring to FIG. 4, a handling wafer 59 is attached over the interconnect structure 54. As is known in the art, handling wafers may comprise glass, silicon oxide, aluminum oxide, and the like. An adhesive (not shown) is used to glue handling wafer 59 to the interconnect structure 54. In an exemplary embodiment, the adhesive is an ultraviolet (UV) glue, which loses its adhesive quality when exposed to UV lights. The second wafer is then thinned from the side of silicon substrate 52. The resulting total thickness of the remaining structure, including substrate 52 and interconnect structure 54, is preferably between about 10 μm and about 15 μm.

In alternative embodiments wherein the second wafer has an SOI structure as shown in FIG. 3B, semiconductor material 56 is removed, followed by the removal of insulator 58. Silicon substrate 52 is thus exposed.

The exposed surface of silicon substrate 52 is preferably substantially flat, and the unevenness of the exposed surface is preferably less than about 10 Å from the lowest point to the highest point. If deemed necessary, a CMP may be performed to further flatten the surface of silicon substrate 52.

In the preferred embodiment, the exposed surface of the substrate 52 is also plasma treated. The plasma treatment helps remove existing surface contamination, such as tiny particles and moisture. In an exemplary embodiment, the plasma treatment conditions include gases such as nitrogen, $H_2$, and Ar, a pressure of about 700 to about 800 mtorr, a temperature of about 20° C. to about 200° C., and a duration of about 2 seconds to about 40 seconds.

Figure 5:
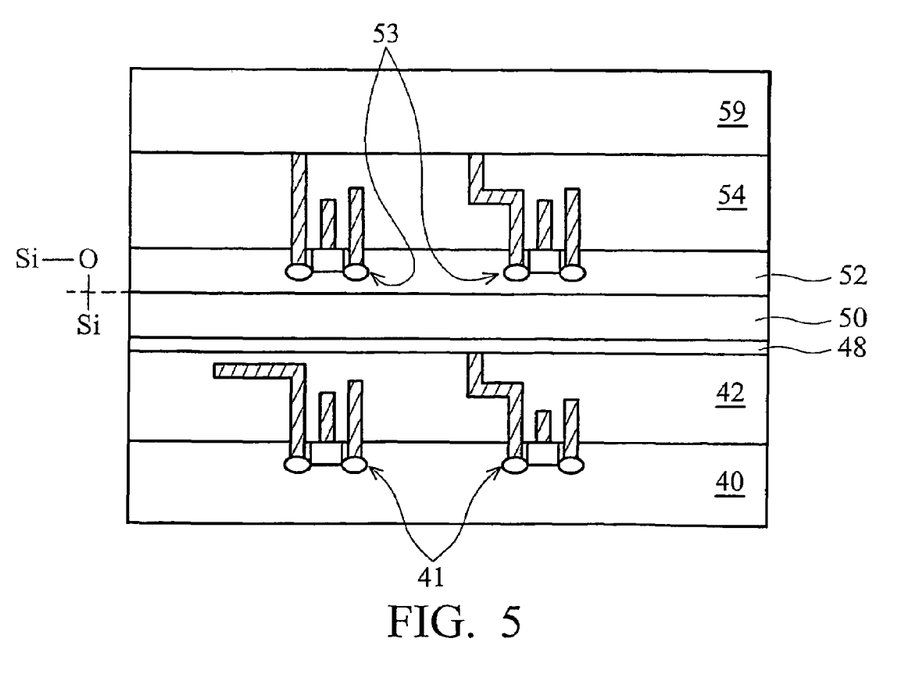

Referring to FIG. 5, the second wafer shown in FIG. 4 is placed on top of the first wafer shown in FIG. 2. The two wafers are aligned. A bonding process is then performed by applying a pressure to force the first and second wafers against each other. The pressure is preferably applied for a duration greater than about 0.5 seconds. During the bonding process, the atoms on silicon oxide layer 50, such as oxygen atoms, form covalent bonds with silicon atoms on silicon substrate 52, thus bonding silicon oxide layer 50 and silicon substrate 52 together. The dangling bonds on the surface of silicon oxide layer 50 further increase the probability of forming cross-layer covalent bonds. As a result, the bonding between the silicon oxide layer 50 and the silicon substrate 52 is stable.

Bonding can only be formed where silicon oxide layer 50 is in contact with silicon substrate 52. Therefore, it is important that both silicon oxide layer 50 and silicon substrate 52 have surfaces as flat as possible. The unevenness also needs to be as small as possible to increase the contact areas.

An advantageous feature of the preferred embodiment of the present invention is that the pressure needed for the bonding can be significantly lower than the pressures used in conventional methods. Preferably, the pressure is less than about 20 pounds per square inch (psi), and more preferably less than about 10 psi. In exemplary embodiments, two wafers were successfully bonded under pressures of between about 5 psi and about 10 psi. Under such low pressures, the low-k dielectric materials in the first and the second wafers are not substantially condensed, and the k values are not noticeably increased.

The bonded wafers are then annealed. In the preferred embodiment, the anneal temperature is between about 250° C. and about 400° C., which is in a desirable range for preserving the characteristics of the low-k materials without increasing the respective k values. Compared to some conventional bonding processes, such as direct copper bonding and direct oxide bonding, the temperature is significantly lower. The preferred duration of the annealing is between about 10 minutes and about 60 minutes.

Figure 6:
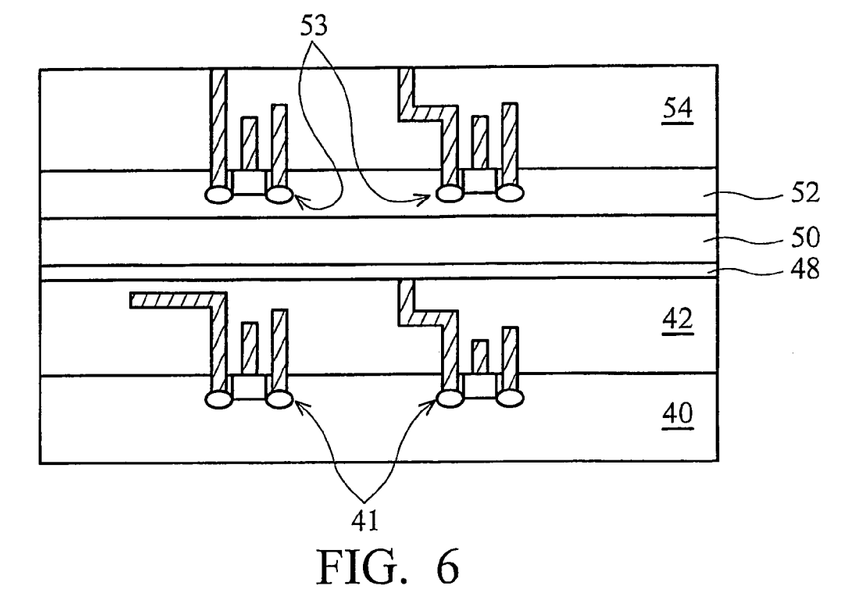

FIG. 6 illustrates the removal of handling wafer 59. In an exemplary embodiment wherein UV glue is used, the UV glue is exposed to UV lights, so that the UV glue loses its adhesive properties, and the handling wafer is easily detached.

Figure 7:
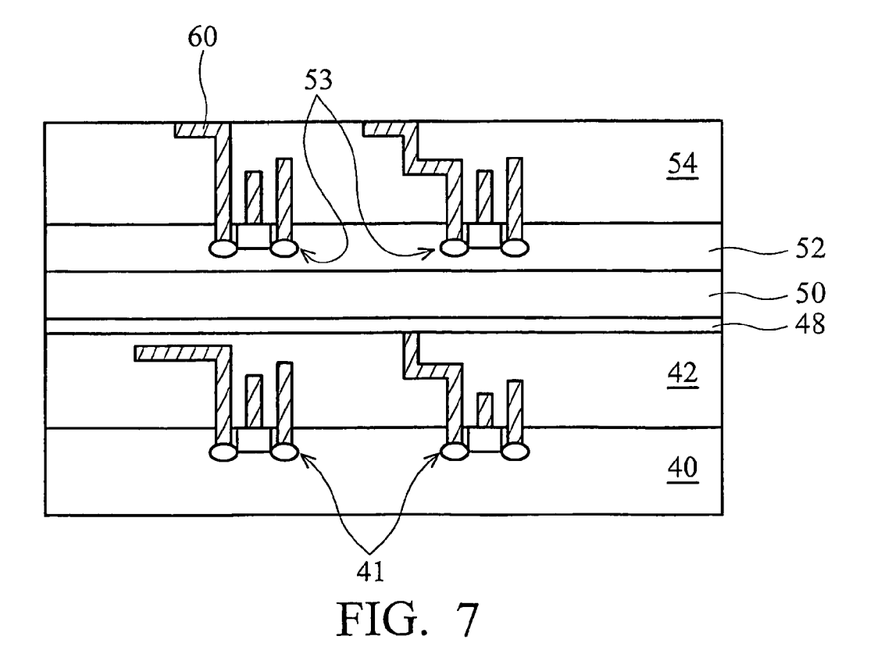

FIG. 7 illustrates the formation of a metallization layer on top of the previously formed structure. Alternatively, the metallization layer may be pre-formed when the interconnect structure 54 is formed. The metallization layer includes a metal line 60. As is known in the art, the metallization layer may be formed using a damascene process, in which a dielectric layer is formed over the interconnect structure 54, openings are formed in the dielectric layer, a metallic material, preferably copper or copper alloys, is filled in the openings, and a CMP is then performed to remove excess metallic material.

Figure 8:
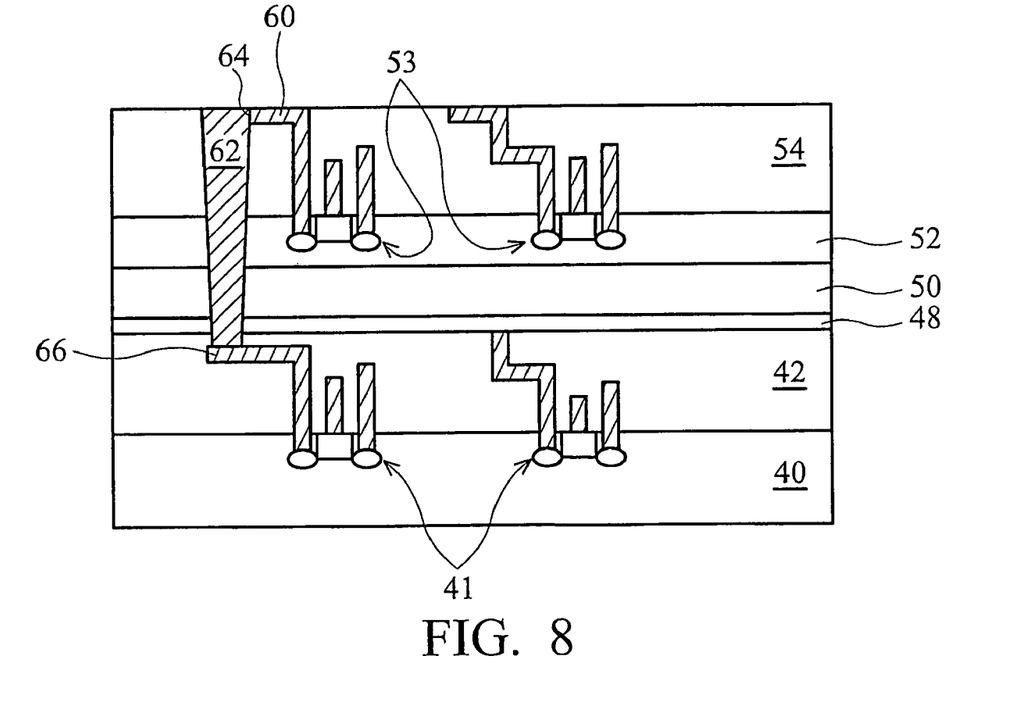

FIG. 8 illustrates the formation of a via 62. Preferably, an opening is formed extending from the top surface of the top metallization layer to a metal line 66 in interconnect structure 42. A side edge 64 of the metal line 60 is preferably exposed from within the opening. A metallic material is then filled in the opening, connecting the metal line 60 and the metal line 66. Excess metallic material is then removed by a CMP. The remaining metallic material forms a via 62.

The integrated circuits in the first wafer and the second wafer are thus interconnected. If the resulting structure in FIG. 8 is considered as a first wafer, and the processes illustrated in FIGS. 2 through 8 are repeated, more wafers (not shown) can be bonded to the structure in FIG. 8.

The previously discussed embodiment is commonly referred to as back-to-front bonding since a back side of the second wafer is bonded to a front side of the first wafer. One skilled in the art will realize that with the teaching in the preferred embodiments, back-to-back bonding and front-to-front bonding can also be performed. These embodiments preferably include providing or forming a silicon layer on a desired side of one wafer, and providing or forming a silicon oxide layer on a desired side of another wafer. Two wafers are then bonded by forming covalent bonds between the silicon oxide layer and the silicon layer. One skilled in the art will realize the respective process steps.

By utilizing the covalent bonds between silicon atoms and oxygen atoms, the preferred bonding process can be performed under a low pressure and a low temperature, thus the characteristics of the low-k dielectric materials, particularly porosities and k values, can be preserved. Therefore, the preferred embodiments of the present invention are well-suited for forming 3D integrated circuits comprising low-k dielectric materials.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming three-dimensional integrated circuits, the method comprising:
   providing a first wafer comprising a first substrate;
   forming a silicon oxide layer over the first substrate;
   providing a second wafer comprising a second substrate, the second substrate comprising a semiconductor layer, an insulator layer adjoining the semiconductor layer, and a silicon layer adjoining the insulator layer;
   thinning the second wafer by removing the semiconductor layer and the insulator layer, wherein the silicon layer is exposed;
   bonding the first and the second wafers by placing a top surface of the silicon oxide layer against a top surface of the silicon layer and applying a pressure; and
   forming vias electrically interconnecting integrated circuits in the first and second wafers.

2. The method of claim 1 further comprising performing a chemical mechanical polish to the silicon oxide layer before the step of bonding.

3. The method of claim 1 further comprising performing a plasma treatment to at least one of the silicon oxide layer and the silicon layer before the step of bonding.

4. The method of claim 1 wherein the pressure is less than about 20 psi.

5. The method of claim 1, wherein the silicon oxide layer is formed using a low-thermal budget method.

6. The method of claim 1, wherein the silicon oxide layer is formed using plasma enhanced chemical vapor deposition.

7. The method of claim 1 further comprising chemical mechanical polishing the silicon oxide layer to substantially flatten the top surface of the silicon oxide layer.

8. The method of claim 1 further comprising a plasma treatment to treat the silicon oxide layer before the step of bonding.

9. The method of claim 1, wherein the pressure is between about 5 psi and about 10 psi.

10. The method of claim 1 further comprising an annealing after the bonding step, wherein the annealing is performed at a temperature of lower than about 400° C.

11. The method of claim 10, wherein the annealing is performed at a temperature of about 250° C.

12. The method of claim 11, wherein at least one of the first and the second interconnect structures comprises a low-k dielectric material having a k value of less than about 3.1.

13. A method of forming three-dimensional integrated circuits, the method comprising:
   providing a first wafer comprising a first interconnect structure over a first substrate, wherein the first interconnect structure comprises a first low-k dielectric material;
   forming a silicon oxide layer over the first interconnect structure using plasma enhanced chemical vapor deposition;
   performing a chemical mechanical polish on the silicon oxide layer;
   performing a plasma treatment on the silicon oxide layer;
   providing a second wafer comprising a second interconnect structure over a second substrate, wherein the second substrate is a silicon-on-insulator substrate, and wherein the second interconnect structure comprises a second low-k dielectric material;
   attaching a handling wafer over the second interconnect structure;
   thinning the second substrate by removing a semiconductor layer and an insulator in the silicon-on-insulator substrate, wherein a silicon layer adjoining the insulator is exposed;
   bonding the first and the second wafers by placing a top surface of the silicon oxide layer against a surface of the silicon layer of the second substrate and applying a pressure;
   removing the handling wafer; and
   forming vias connecting the first interconnect structure and the second interconnect structure.

14. The method of claim 13 further comprising treating a surface of the silicon layer of the second substrate using a plasma treatment after the thinning step.

15. The method of claim 13, wherein after the thinning step, the second interconnect structure and the second substrate have a total thickness of between about 10 μm and about 15 μm.

16. The method of claim 13, wherein the top surface of the silicon oxide layer and the surface of the silicon layer of the second substrate have an unevenness of less than about 10 Å before the step of bonding.

17. The method of claim 13, wherein the first and the second low-k dielectric materials have k values of less than about 3.1.

* * * * *

UNITED STATES PATENT AND TRADEMARK OFFICE
CERTIFICATE OF CORRECTION

PATENT NO.       : 7,371,662 B2
APPLICATION NO.  : 11/385968
DATED            : May 13, 2008
INVENTOR(S)      : Chiou

Page 1 of 1

It is certified that error appears in the above-identified patent and that said Letters Patent is hereby corrected as shown below:

On the Title Page, Section (56) References Cited, U.S. PATENT DOCUMENTS, 1$^{st}$ entry, delete "435/455" and insert --438/455--.
On the Title Page, Section (57) ABSTRACT, 2$^{nd}$ sentence, line 10; delete "preformed" and insert --performed--.
In Col. 2, line 31, delete "preformed" and insert --performed--.

Signed and Sealed this

Twenty-ninth Day of July, 2008

JON W. DUDAS
*Director of the United States Patent and Trademark Office*